(12) United States Patent
Park et al.

(10) Patent No.: US 8,697,579 B2
(45) Date of Patent: Apr. 15, 2014

(54) METHOD OF FORMING AN ISOLATION STRUCTURE AND METHOD OF FORMING A SEMICONDUCTOR DEVICE

(75) Inventors: Joo-Sung Park, Seoul (KR); Se-Myeong Jang, Anyang-si (KR); Gil-Sub Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 172 days.

(21) Appl. No.: 13/362,142

(22) Filed: Jan. 31, 2012

(65) Prior Publication Data

US 2012/0202336 A1 Aug. 9, 2012

(30) Foreign Application Priority Data

Feb. 9, 2011 (KR) ........................ 10-2011-0011408

(51) Int. Cl.
*H01L 21/311* (2006.01)

(52) U.S. Cl.
USPC .... 438/700; 438/311; 438/690; 257/E21.006; 257/21.027; 257/E21.058; 257/E21.007; 257/E21.094; 257/E21.17; 257/E21.32

(58) Field of Classification Search
USPC ......... 438/700, 680, 692, 311, 675, 723, 724, 438/755, 756, 757, 738, 752, 753, 509; 257/E21.006, E21.027, E21.058, 257/E21.077, E21.094, E21.17, E21.32
See application file for complete search history.

(56) References Cited

U.S. PATENT DOCUMENTS

| | | | | |
|---|---|---|---|---|
| 7,714,379 B2 * | 5/2010 | Lee | | 257/324 |
| 7,902,024 B2 * | 3/2011 | Lee et al. | | 438/267 |
| 8,017,495 B2 * | 9/2011 | Kim et al. | | 438/427 |
| 8,173,515 B2 * | 5/2012 | Nakamori et al. | | 438/435 |
| 8,237,240 B2 * | 8/2012 | Kim et al. | | 257/506 |
| 2008/0160718 A1 | 7/2008 | Lee et al. | | |

FOREIGN PATENT DOCUMENTS

| KR | 10-2007-0102271 A | 10/2007 |
|---|---|---|
| KR | 10-0825014 B1 | 4/2008 |
| KR | 10-2010-0047496 A | 5/2010 |

\* cited by examiner

*Primary Examiner* — David Nhu
(74) *Attorney, Agent, or Firm* — Lee & Morse, P.C.

(57) ABSTRACT

A method of forming an isolation structure includes forming a trench at an upper portion of a substrate, forming a first oxide layer on an inner wall of the trench, oxidizing a portion of the substrate adjacent to the trench to form a second oxide layer such that the portion of the substrate adjacent to the trench has the first oxide layer thereon, forming a nitride layer on the first oxide layer, and forming an insulation layer pattern on the nitride layer such that the insulation layer pattern fills a remaining portion of the trench.

20 Claims, 16 Drawing Sheets

FIRST DIRECTION
⊗⟶ SECOND DIRECTION

FIRST DIRECTION
⊗⟶ SECOND DIRECTION

FIRST DIRECTION

SECOND DIRECTION

SECOND DIRECTION

⊗⟶ FIRST DIRECTION

US 8,697,579 B2

METHOD OF FORMING AN ISOLATION STRUCTURE AND METHOD OF FORMING A SEMICONDUCTOR DEVICE

CROSS-REFERENCE TO RELATED APPLICATION

Korean Patent Application No. 10-2011-0011408, filed on Feb. 9, 2011, in the Korean Intellectual Property Office, and entitled: "Method of Forming an Isolation Structure," is incorporated by reference herein in its entirety.

BACKGROUND

As the integration degree of semiconductor devices increases, the size of an isolation layer may be decreases.

SUMMARY

Embodiments may be realized by providing a method of forming an isolation structure that includes forming a trench at an upper portion of a substrate, forming a first oxide layer on an inner wall of the trench, oxidizing a portion of the substrate adjacent to the trench to form a second oxide layer such that the portion of the substrate adjacent to the trench has the first oxide layer thereon, forming a nitride layer on the first oxide layer, and forming an insulation layer pattern on the nitride layer such that the insulation layer pattern fills a remaining portion of the trench.

The first oxide layer may be formed by a chemical vapor deposition process. The first oxide layer and the second oxide layer may have compressive stresses and the nitride layer may have a tensile stress. The insulation layer pattern may be formed using a flowable oxide. Forming the insulation layer pattern may include performing a heat treatment process. Forming the trench may include forming a mask on the substrate and etching the upper portion of the substrate using the mask as an etching mask.

Embodiments may also be realized by providing a method of forming an isolation structure that includes forming a plurality of trenches at upper portions of a substrate, the trenches have different widths from each other, forming a first oxide layer on inner walls of the trenches, oxidizing a portion of the substrate adjacent to each of the trenches to form a second oxide layer such that each of the trenches has the first oxide layer formed thereon, forming a nitride layer on the first oxide layer, and forming an insulation layer pattern on the nitride layer such that the insulation layer pattern fills remaining portions of the trenches.

The first oxide layer may be formed by a chemical vapor deposition process. The first oxide layer and the second oxide layer may have compressive stresses and the nitride layer may have a tensile stress. The insulation layer pattern may be formed using a flowable oxide. Forming the insulation layer pattern may include performing a heat treatment process.

Forming the trenches may include forming a mask on the substrate and etching upper portions of the substrate using the mask as an etching mask. The first oxide layer may be formed on the mask and on inner walls of each of the trenches. Forming the insulation layer pattern may include forming an insulation layer on the nitride layer such that the insulation layer fills remaining portions of the trenches, and planarizing upper portions of the insulation layer, the nitride layer, and the first oxide layer until a top surface of the substrate is exposed.

The method of forming an isolation layer may include, after forming the insulation layer, performing a heat treatment process on the insulation layer. Forming the mask may include forming a mask layer on the substrate, forming a sacrificial layer pattern on the mask, forming a spacer on a sidewall of the sacrificial layer pattern, removing the sacrificial layer pattern, and patterning the mask layer using the spacer as an etching mask.

Embodiments may also be realized by providing a method of forming a semiconductor device that includes forming a plurality of first trenches adjacent to first active regions and forming a plurality of second trenches adjacent to second active regions, the first and second trenches being formed in a substrate, and the second trenches having a greater width than the first trenches. The method includes forming a first oxide layer on inner walls of the first and second trenches, forming a second oxide layer by oxidizing portions of the substrate surrounding the first and second trenches, the second oxide layer is formed after forming the first oxide layer such that the second oxide layer is between the substrate and the first oxide layer, forming a nitride layer on the first oxide layer in the first and second trenches, and forming an insulation layer pattern on the nitride layer such that the insulation layer pattern fills remaining portions of the first and second trenches.

The nitride layer may be formed directly on the first oxide layer after forming the second oxide layer. The method of forming a semiconductor device may include forming first gate structures in the substrate in the first active regions, and forming second gate structures on the substrate in the second active regions. The nitride layer may have a tensile stress substantially equal to a total of a compressive stress of the first oxide layer and a compressed stress of the second oxide layer. The nitride layer may be conformally formed on inner walls of the first and second trenches.

Embodiments may also be realized by providing a first oxide layer on an inner wall of a trench of a substrate and an active region of the substrate adjacent to the trench having the first oxide layer thereon may be oxidized to form a second oxide layer. A nitride layer may be on a second oxide layer and an insulation layer may be on the nitride layer to fill a remaining portion of the trench.

BRIEF DESCRIPTION OF THE DRAWINGS

Features will become apparent to those of ordinary skill in the art by describing in detail exemplary embodiments with reference to the attached drawings, in which.

DETAILED DESCRIPTION OF THE EMBODIMENTS

Figure 1:
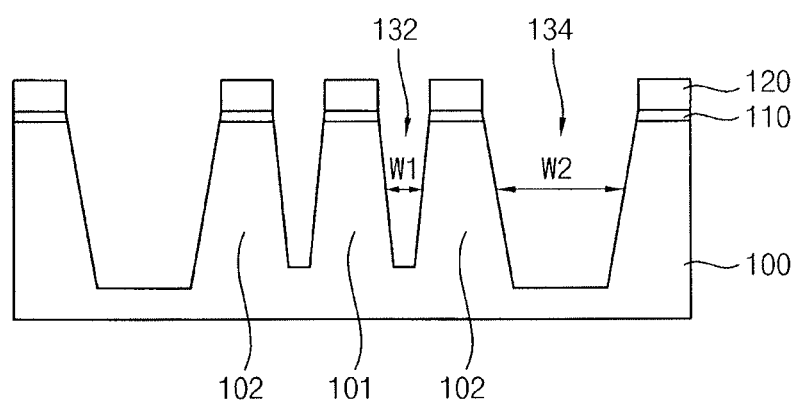
FIGS. 1 to 6 illustrate cross-sectional views depicting stages in a method of forming an isolation structure, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. It will be understood that when an element or layer is referred to as being "on," "connected to" or "coupled to" another element or layer, it can be directly on, connected or coupled to the other element or layer or intervening elements or layers may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings.

Spatially relative terms, such as "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, elements, and/or components, but do not preclude the presence or addition of one or more other features, integers, steps, elements, components, and/or groups thereof.

Example embodiments are described herein with reference to cross-sectional illustrations that are schematic illustrations of exemplary embodiments (and intermediate structures). As such, variations from the shapes of the illustrations as a result, e.g., of manufacturing techniques and/or tolerances, may be expected. Thus, the embodiments should not be construed as limited to the particular shapes of regions illustrated herein but are to include deviations in shapes that result, e.g., from manufacturing. For example, an implanted region illustrated as a rectangle may have rounded or curved features and/or a gradient of implant concentration at its edges rather than a binary change from implanted to non-implanted region. A buried region formed by implantation may result in some implantation in the region between the buried region and the surface through which the implantation takes place. Thus, the regions illustrated in the figures are schematic in nature and their shapes are not intended to limit the scope of the embodiments.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIGS. 1 to 6 illustrate cross-sectional views depicting stages in a method of forming an isolation structure, according to an exemplary embodiment.

Referring to FIG. 1, a pad layer and a mask layer may be sequentially formed on a substrate 100, and the mask layer may be patterned by a photolithography process to form a mask 120. The pad layer and an upper portion of the substrate 100 may be etched using the mask 120 as an etching mask to form a pad layer pattern 110 and recesses in the substrate 100.

The substrate 100 may include a semiconductor substrate, e.g., a silicon substrate, a germanium substrate or a silicon-germanium substrate, a substrate having a semiconductor layer and an insulation layer such as a silicon-on-insulator (SOI) substrate or a germanium-on-insulator (GOI) substrate, or a single crystalline metal oxide substrate.

The pad layer may be formed using, e.g., silicon oxide. In an exemplary embodiment, the pad layer may be formed by thermally oxidizing an upper portion of the substrate 100. The mask layer may be formed using, e.g., silicon nitride.

The recesses of the substrate 100 and sidewalls of the pad layer pattern 110 and the mask 120 may define first and second trenches 132 and 134. Portions of the substrate 100 between the first and second trenches 132 and 134 may be referred to as an active region. The first trench 132 may have a first width W1 and the second trench 134 may have a second width W2. The first width W1 and the second width W2 may extend in a first direction between adjacent active regions. The first width W1 may be smaller, e.g., substantially smaller, than the second width W2 in the first direction.

According to an exemplary embodiment, a plurality of first trenches 132 and a plurality of second trenches 134 may be formed. For example, a pattern of two first trenches 132 and two second trenches 134 may be formed such that the two first trenches 132 are between the two second trenches 134. Various patterns of the first and the second trenches 132 and 134 may be repeatedly formed on the substrate 100. A portion of the substrate 100 between the first trenches 132 may be referred to as a first active region 101. A portion of the substrate 100 between the first trench 132 and the second trench 134 may be referred to as a second active region 102.

Figure 2:
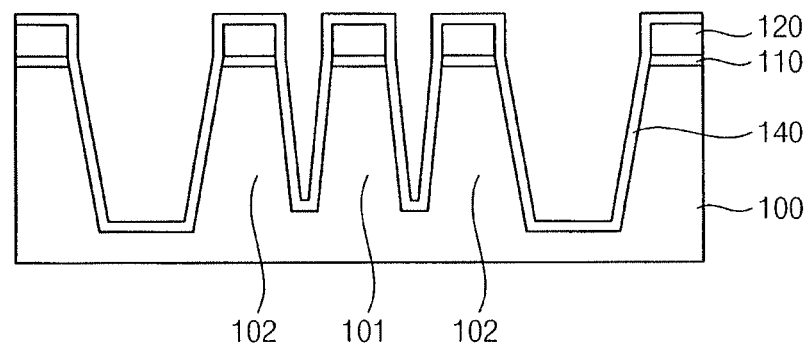

Referring to FIG. 2, a first oxide layer 140 may be formed on inner walls of the first and second trenches 132 and 134 and on the mask 120, e.g., on an upper surface of the mask 120. The first oxide layer 140 may be a continuous layer covering exposed regions on the substrate 100.

According to an exemplary embodiment, the first oxide layer 140 may be formed using an oxide. For example, the oxide may be deposited by a chemical vapor deposition (CVD) process. The first oxide layer 140 may have, e.g., a compressive stress equal to or less than about 5 GPa. For example, an oxide in the first oxide layer 140 may be selected to form a layer having the compressive stress equal to or less than about 5 GPa. The range for the compressive stress of the first oxide layer 140 may be a narrower range that includes, but is not limited to, e.g., about 1 GPa to about 5 GPa, about 1 GPa to about 4 GPa, about 1.5 GPa to about 3.5 GPa, about 2 GPa to about 3 GPa, etc.

Figure 3:
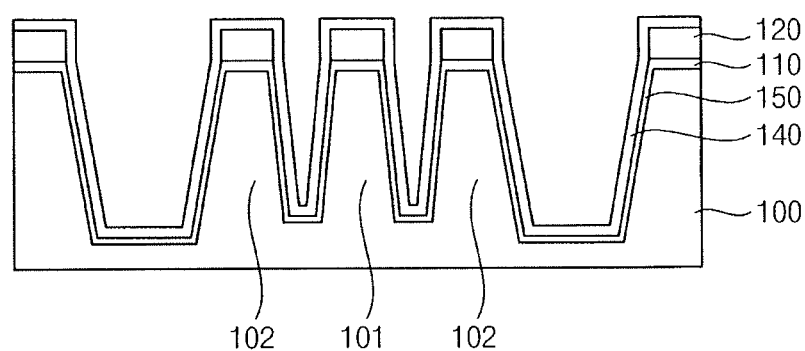

Referring to FIG. 3, portions of the substrate 100 adjacent to the first and second trenches 132 and 134 having the first oxide layer 140 thereon may be oxidized to form a second oxide layer 150. Portions of the substrate 100 damaged during the formation of the first and second trenches 132 and 134 may be cured by the second oxide layer 150, according to an exemplary embodiment.

The second oxide layer 150 may be formed by a thermal oxidation process, a radical oxidation process, or a plasma oxidation process. In the oxidation process, oxygen may be combined with silicon in the substrate 100 through the first oxide layer 140. Accordingly, the second oxide layer 150 may have a relatively small thickness compared to an oxide layer formed by an oxidation process directly on a surface of the substrate 100.

The first and second active regions 101 and 102 of the substrate 100 may have varying areas, e.g., upper portions of the first and second active regions 101 to 102 may have larger or smaller areas than lower portions thereof. For example, the first width W1 of the first trench 132 and the second width W2 of the second trench 134 may increase as a distance from the substrate 100 increases. As such, the area of the upper portion of the first trench 132 may be larger than the area of the lower portion of the first trench 132 so that the area of an adjacent first action region 101 may be greater at a lower portion thereof than an upper portion thereof.

Inner spaces, e.g., an area of the inner spaces, of the first and second trenches 132 and 134 may not decrease by the formation of the second oxide layer 150. For example, the second oxide layer 150 may be formed by the oxidation process after the first oxide layer 140 has already been formed on the inner walls of the first and second trenches 132 and 134. The second oxide layer 150 may be formed under the first oxide layer 140, e.g., between the substrate 100 and the first oxide layer 140. The second oxide layer 150 may be continuous with the pad layer pattern 110. For example, both the second oxide layer 150 and the pad layer forming the pad layer pattern 110 may be formed by stages that include oxidizing a surface of the substrate 100.

The second oxide layer 150 may have, e.g., a compressive stress equal to or more than about 10 GPa. For example, an oxide in the second oxide layer 150 may be selected to form a layer having the compressive stress equal to or more than about 10 GPa. The range for the compressive stress of the second oxide layer 150 may be a narrower range that includes, but is not limited to, e.g., about 10 GPa to about 50 GPa, about 10 GPa to about 100 GPa, etc.

Figure 4:
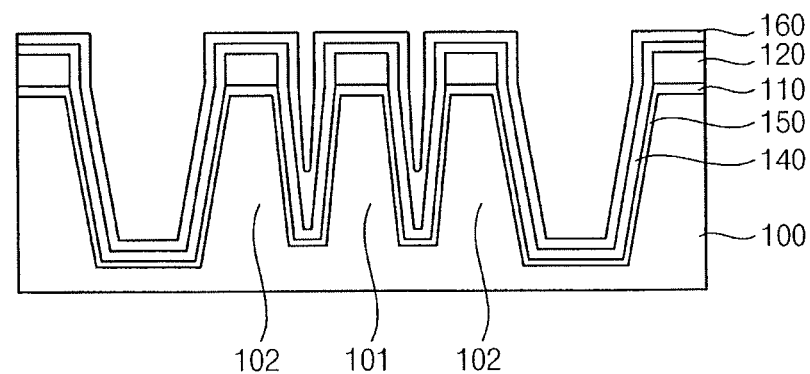

Referring to FIG. 4, a first nitride layer 160 may be formed on the first oxide layer 140. The first nitride layer 160 may be formed by, e.g., a CVD process or a low pressure chemical vapor deposition (LPCVD) process.

The first nitride layer 160 may have, e.g., a tensile stress equal to or more than about 10 GPa. A nitride in the first nitride layer 160 may be selected to form a layer having a tensile stress equal to or more than about 10 GPa. The range for the tensile stress of the first nitride layer 160 may be a narrower range that includes, but is not limited to, e.g., about 10 GPa to about 50 GPa, about 10 GPa to about 100 GPa, etc.

According to an exemplary embodiment, the first nitride layer 160 may have an amount of a tensile stress substantially the same as or similar to a total amount of the compressive stresses that the first and second oxide layers 140 and 150 have. Without intending to be bound by this theory, the first and second active regions 101 and 102 adjacent to the first and second trenches 132 and 134 may not be stressed and/or may not be substantially stressed by the first and second oxide layers 140 and 150 and the first nitride layer 160.

Alternatively, the first nitride layer 160 may have an amount of a tensile stress different from the total amount of the compressive stresses that the first and second oxide layers 140 and 150 have. According to an exemplary embodiment, the inner spaces of the first and second trenches 132 and 134 may not be decreased by the formation of the second oxide layer 150 and the first nitride layer 160 may be conformally formed in the first trench 132, e.g., the narrower trench of the first and second trenches 132 and 134, having a relatively small width.

The first nitride layer 160 having a tensile stress may be conformally formed on inner walls of the first and the second trenches 132 and 134. Accordingly, the first and second active regions 101 and 102, e.g., the second active region 102 between one of the first trenches 132 and one of the second trenches 134, may be under substantially the same stress from both sides. Accordingly, the possibility of the active regions 101 and 102 leaning toward a certain side by the stress may be reduced so that, e.g., the active regions 101 and 102 may not be leaning and may be substantially upright.

Figure 5:
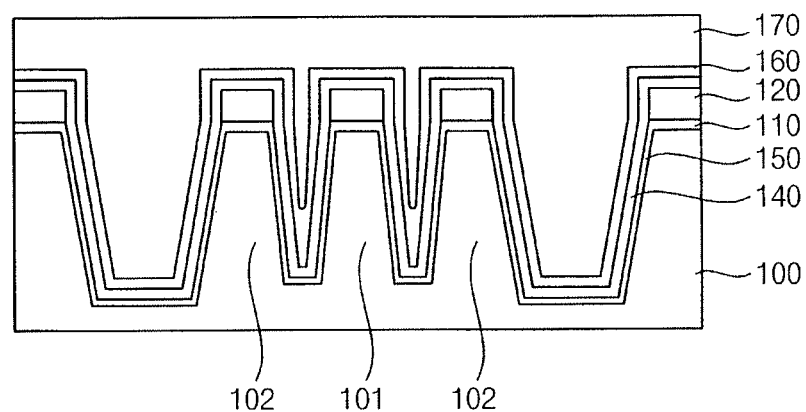

Referring to FIG. 5, a first insulation layer 170 may be formed on the first nitride layer 160 to sufficiently fill, e.g., completely fill, remaining portions of the first and second trenches 132 and 134.

According to an exemplary embodiment, the first insulation layer 170 may be formed using an oxide having desired gap-filling characteristics. The first insulation layer 170 may be formed by a CVD process, e.g., the oxide may be deposited by the CVD process. For example, the first insulation layer 170 may be formed using at least one of tonen silazene (TOSZ), flowable oxide (FOX), spin on glass (SOG), etc.

Figure 6:
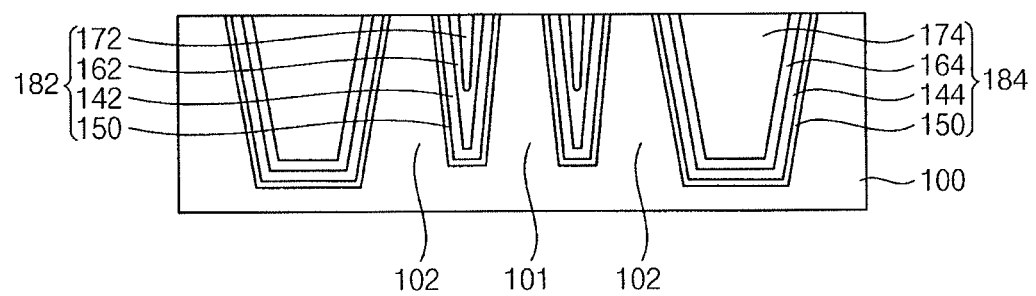

Referring to FIG. 6, a planarization process may be performed on the first insulation layer 170 until a top surface of the substrate 100 is exposed. The planarization process may remove upper portions of the first insulation layer 170, upper portions of the first nitride layer 160, upper portions of the first oxide layer 140, the mask 120, and the pad layer pattern 110. Lower portions of the first insulation layer 170, lower portions of the first nitride layer 160, the second oxide layer 150, and lower portions of the first oxide layer 140 may remain in the first and second trenches 132 and 134.

Accordingly, a first isolation structure 182 and a second isolation structure 184 may be formed in the first trench 132 and the second trench 134, respectively. The first isolation structure 182 may include the second oxide layer 150, a first oxide layer pattern 142, a first nitride layer pattern 162 and a first insulation layer pattern 172 sequentially stacked in the first trench 132. For example, the first isolation structure 182 may be a stacked structure on sidewalls and a bottom surface of the first trench 132. The second isolation structure 184 may include the second oxide layer 150, a second oxide layer pattern 144, a second nitride layer pattern 164 and a second insulation layer pattern 174 sequentially stacked in the second trench 134. For example, the second isolation structure 184 may be a stacked structure on sidewalls and a bottom surface of the second trench 134.

By performing above described processes, the first and second isolation layer structures 182 and 184 may be formed. The characteristics of the first and second isolation layer structures 182 and 184, in accordance with an exemplary embodiment, may be compared with those of a comparative embodiment, e.g., the comparative embodiment discussed below.

FIGS. 7 to 10 illustrate cross-sectional views depicting stages in a method of forming an isolation structure, according to a comparative embodiment.

Figure 7:
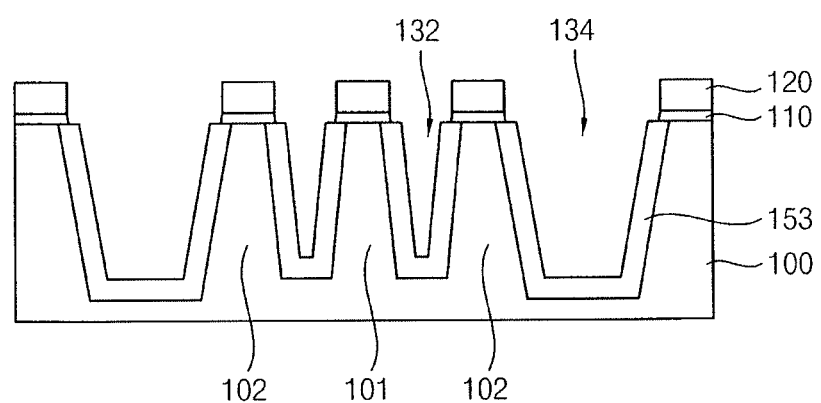
FIGS. 7 to 10 illustrate cross-sectional views depicting stages in a method of forming an isolation structure, according to a comparative embodiment.

Referring to FIG. 7, after performing processes illustrated with reference to FIG. 1, a portion of a substrate 100 adjacent to first and second trenches 132 and 134 may be oxidized to form a fourth oxide layer 153 directly on the substrate 100. The fourth oxide layer 153 may be formed by, e.g., a thermal oxidation process, a radical oxidation process, or a plasma oxidation process. During the formation of the fourth oxide layer 153, portions of the substrate 100 damaged during the formation of the first and second trenches 132 and 134 may be cured.

Since the oxidation process may be directly performed on a surface of the substrate 100, the fourth oxide layer 153 may be formed to have a thickness substantially larger than a thickness of the second oxide layer 150 illustrated with reference to FIG. 3. Accordingly, inner spaces of the trenches 132 and 134 may be decreased due to the fourth oxide layer 153 formed by the oxidation process directly on the substrate 100.

Figure 8:
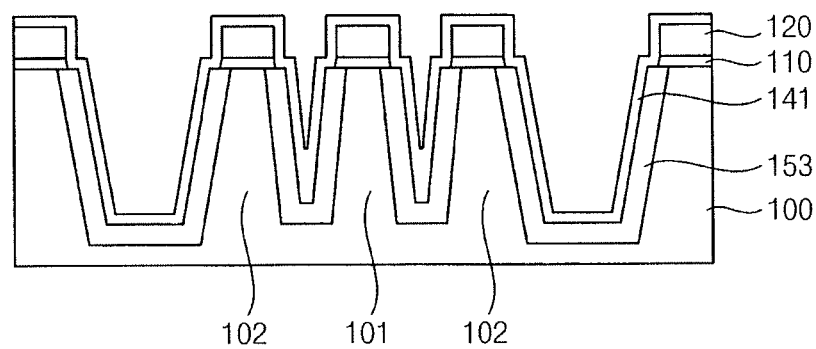

Referring to FIG. 8, a third oxide layer 141 may be formed on the fourth oxide layer 153, a pad layer pattern 110, and a mask 120. The third oxide layer 141 may be formed using an oxide by a CVD process, according to an exemplary embodiment.

Figure 9:
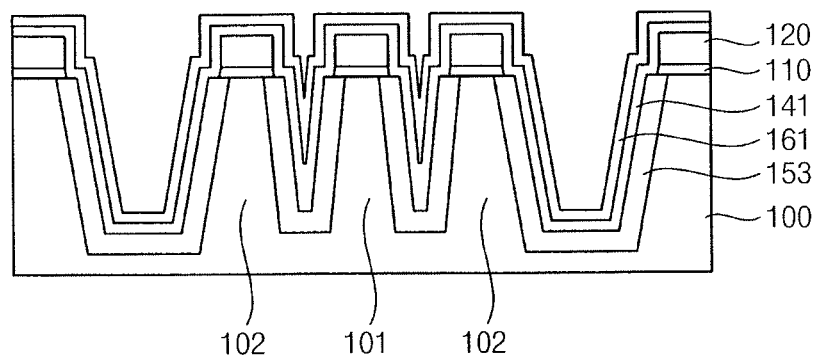

Referring to FIG. 9, a second nitride layer 161 may be formed on the third oxide layer 141. The second nitride layer 161 may be formed by, e.g., a CVD process or an LPCVD process. The second nitride layer 161 may not be conformally formed in the first trench 132 having a relatively small width. For example, a lower portion of the first trench 132 may be mostly filled with the fourth oxide layer 153 and the third oxide layer 141. As such, the second nitride layer 161 may be excluded or not formed in the lower portion of the first trench 132. The second nitride layer 161 may not be formed to have a sufficient thickness at an upper portion of the first trench 132 for isolating unit cells.

In the case of a second active region 102, e.g., that is between the narrower first trench 132 and the second trench 134, a portion of the substrate 100 adjacent to the second trench 134 may not be under a stress by the third and fourth oxide layers 141 and 153 and the second nitride layer 161, and a portion of the substrate 100 adjacent to the first trench 132 may be under a stress by the third and fourth oxide layers 141 and 153 and the second nitride layer 161. As such, the side of the second active region 102 adjacent to the second trench 134 may have a greater amount of stress thereon as compared to the side of the second active region 102 adjacent to the first trench 132. Accordingly, the second active region 102 may lean toward a side, e.g., toward a first active region 101 due to the directionality of the greater amount of stress.

Figure 10:
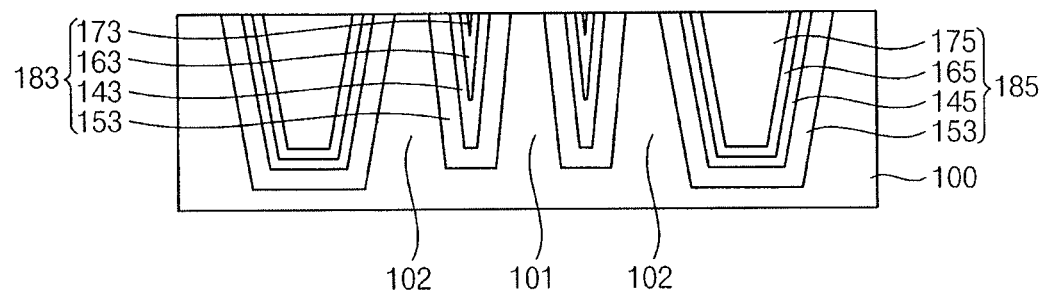

Referring to FIG. 10, a second insulation layer may be formed on the second nitride layer 161 to sufficiently fill remaining portions of the first and second trenches 132 and 134. Thereafter, the second insulation layer may be planarized to expose the substrate 100. Thus, a third isolation structure 183 and a fourth isolation structure 185 may be formed in the first trench 132 and the second trench 134, respectively. The third isolation structure 183 may include the fourth oxide layer 153, a third oxide layer pattern 143, a third nitride layer pattern 163, and a third insulation layer pattern 173 sequentially stacked. The fourth isolation structure 185 may include the fourth oxide layer 153, a fifth oxide layer pattern 145, a fourth nitride layer pattern 165 and a fourth insulation layer pattern 175 sequentially stacked.

As described above, in the case of the third and fourth isolation structures 183 and 185 in accordance with a comparative embodiment, the second nitride layer 161 may not be conformally formed on the inner wall of the first trench 132 having a relatively small width. Thus, a different amount of stress may be applied at opposing sides of the second active region 102. Accordingly, the second active region 102 may lean, e.g., may lean toward the first active region 101.

In contrast, according to an exemplary embodiment, the first and second isolation structures 182 and 184, the first nitride layer 160 may be conformally formed on the inner wall of the first trench 132 having a relatively small width. Accordingly, e.g., the stress applied by the first nitride layer 160 may be balanced with the stress applied by the first and second oxide layers 140 and 150. As such, the active regions 101 and 102 may not be under a stress by the isolation structures 182 and 184, or may be under a stress by substantially the same amount from both sides so that the active regions 101 and 102 may not lean.

FIGS. 11 to 20 and FIGS. 22 to 30 illustrate cross-sectional views depicting stages in methods of manufacturing semiconductor devices, according to exemplary embodiments. FIG. 21 illustrates a plan view of an exemplary semiconductor device. FIGS. 11 to 20 illustrate cross-sectional views taken along the A-A' line in FIG. 21, and FIGS. 22 to 30 illustrate cross-sectional views taken along the B-B' line in FIG. 21. The methods of manufacturing semiconductor devices may include the method of forming the isolation structure illustrated with reference to FIGS. 1 to 6, and thus repeated explanations thereon may be omitted herein.

Figure 11:
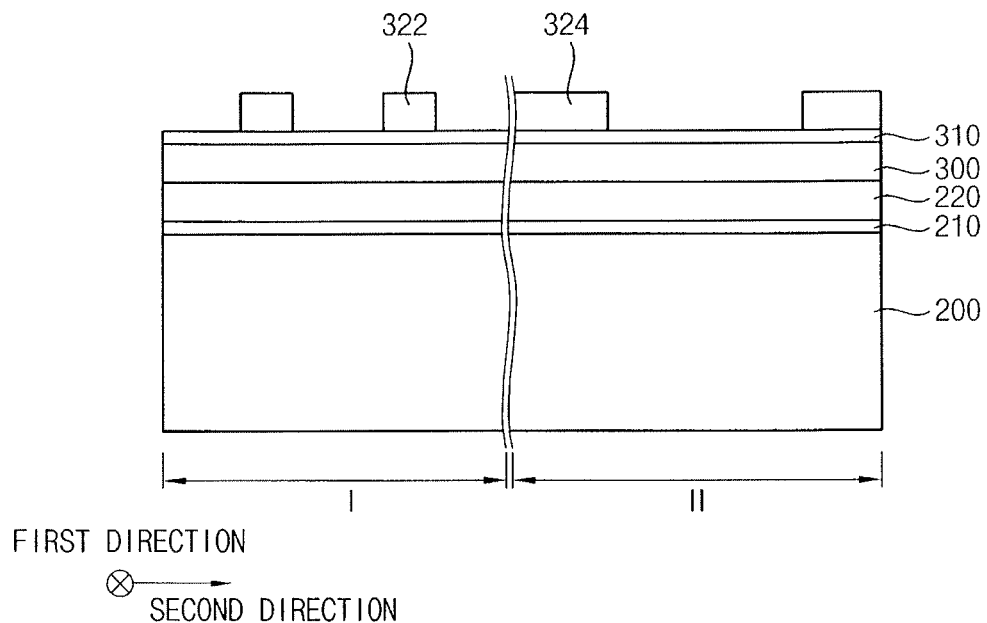
FIGS. 11 to 20 and FIGS. 22 to 30 illustrate cross-sectional views depicting stages in methods of manufacturing semiconductor devices, according to exemplary embodiments.

Referring to FIG. 11, a pad layer 210, a hard mask layer 220, a sacrificial layer 300, and a variable mask layer 310 may be sequentially formed on a substrate 200. The substrate 200 may be divided into a first region I and a second region II, and each of the pad layer 210, the hard mask layer 220, the sacrificial layer 300, and the variable mask layer 310 may be sequentially formed on both the first region I and the second region II. First masks 322 and second masks 324 may be formed on the variable mask layer 310. The first masks 322 and the second masks 324 may be formed in the first region I and the second region II, respectively. For example, the first mask 322 may be formed only in the first region I. The second masks 324 may be formed only in the second region II. The first region I may be a cell region in which memory cells are formed. The second region II may be a peripheral circuit region in which peripheral circuits, e.g., for driving the memory cells, are formed.

The substrate 200 may include a semiconductor substrate, e.g., a silicon substrate, a germanium substrate or a silicon-germanium substrate, a substrate having a semiconductor layer and an insulation layer, e.g., a silicon-on-insulator (SOI) substrate or a germanium-on-insulator (GOI) substrate, or a single crystalline metal oxide substrate.

In example embodiment, the first masks 322 may be formed to have a thickness smaller, e.g., substantially smaller, than a thickness of the second masks 324. For example, the first masks 322 may have a smaller thickness in the second direction as compared to a thickness of the second masks 324 in the second direction. A distance between the first masks 322 may be smaller, e.g., substantially smaller, than a distance between the second masks 324.

According to an exemplary embodiment, the pad layer 210 may be formed using an oxide, and the hard mask layer 220 may be formed using a nitride. However, embodiments are not limited thereto. The sacrificial layer 300 may be formed using, e.g., polysilicon or a carbon containing material such as a carbon-based spin on hardmask (SOH) and silicon carbon nitride (SiCN). The variable mask layer 310 may be formed using, e.g., a material having an etching selectivity with respect to the sacrificial layer 300. The variable mask layer 310 may include, e.g., a silicon containing material such as silicon oxynitride (SiON), silicon oxide (SiOx), a silicon nitride (such as $Si_3N_4$), silicon carbon nitride (SiCN), etc. The first and second masks 322 and 324 may be formed to include a photoresist pattern.

Figure 12:
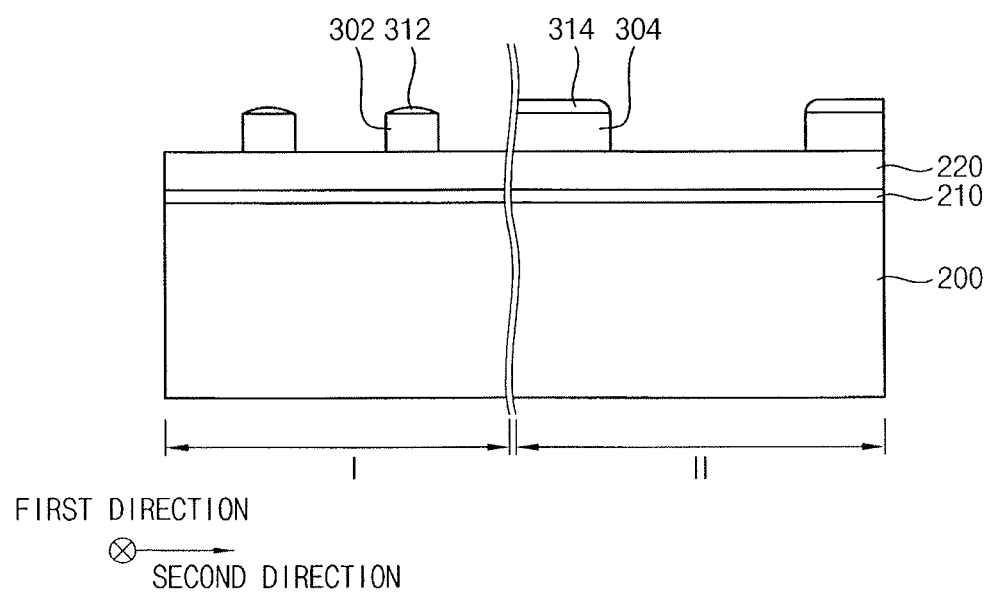

Referring to FIG. 12, the variable mask layer 310 may be etched using the first and second masks 322 and 324 as an etching mask to form first and second variable masks 312 and 324 in the first region I and the second region II, respectively. Thereafter, the first and second mask 322 and 324 may be removed.

After removing the first and second masks 322 and 324, the sacrificial layer 300 may be etched using the first and second variable masks 312 and 314 as an etching mask to form a first sacrificial layer pattern 302 and a second sacrificial layer pattern 304 in the first region I and the second region II, respectively.

The first and second variable masks 312 and 314 may be partially etched during the etching process of the sacrificial layer 300. An upper surface and an edge of the first variable mask 312 may be removed simultaneously, so that the first variable mask 312 may have a rounded and/or curved shape. An edge of the second variable mask 314 may be removed, but an upper surface of the second variable mask 314 may not be removed. Therefore, the first variable mask 312 may have a thickness, e.g., in the first direction, substantially smaller than that of the variable mask layer 310 or the second variable mask 314.

Figure 13:
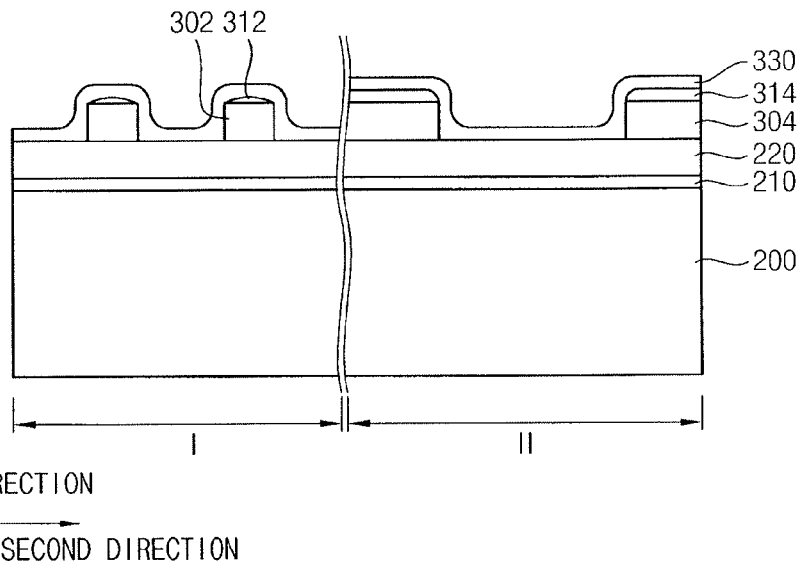

Referring to FIG. 13, a spacer layer 330 may be formed on the hard mask layer 220 to cover the first and second variable masks 312 and 314 and the first and second sacrificial layer patterns 302 and 304. According to an exemplary embodiment, the spacer layer 330 may be formed using, e.g., silicon oxide or silicon nitride. The spacer layer 130 may be formed by, e.g., an ALD process, a CVD process, etc.

Figure 14:
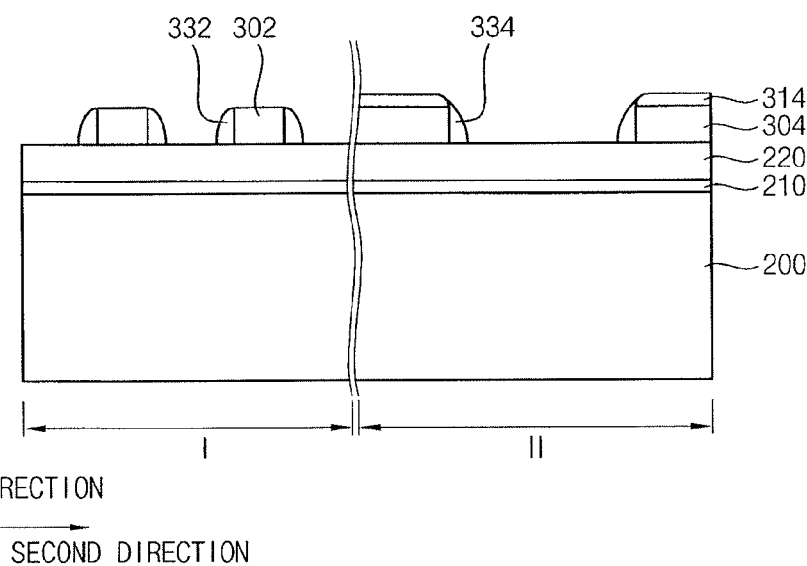

Referring to FIG. 14, the spacer layer 330 may be patterned by an anisotropic etching process, so that a first spacer 332 and a second spacer 334 may be formed on sidewalls of the first and second sacrificial layer patterns 302 and 304, respectively. For example, a plurality of first spacers 332 and a plurality of second spacers 334 may be formed. Each of the first spacers 332 may cover lateral sides of one of the first sacrificial layer patterns 302. Each of the second spacers 334 may cover lateral sides of one of the second sacrificial layer patterns 304.

During the etching process, the first variable mask 312 having a relatively small thickness may also be removed so that, e.g., the first sacrificial layer pattern 302 may be exposed. During the etching process the second variable mask 314 having a relatively large thickness may not be removed completely so that, e.g., at least a portion of the second variable mask 314 may remain on the second sacrificial layer pattern 304. The second spacers 334 may cover lateral sides of the remaining portion of the second variable mask 314.

Figure 15:
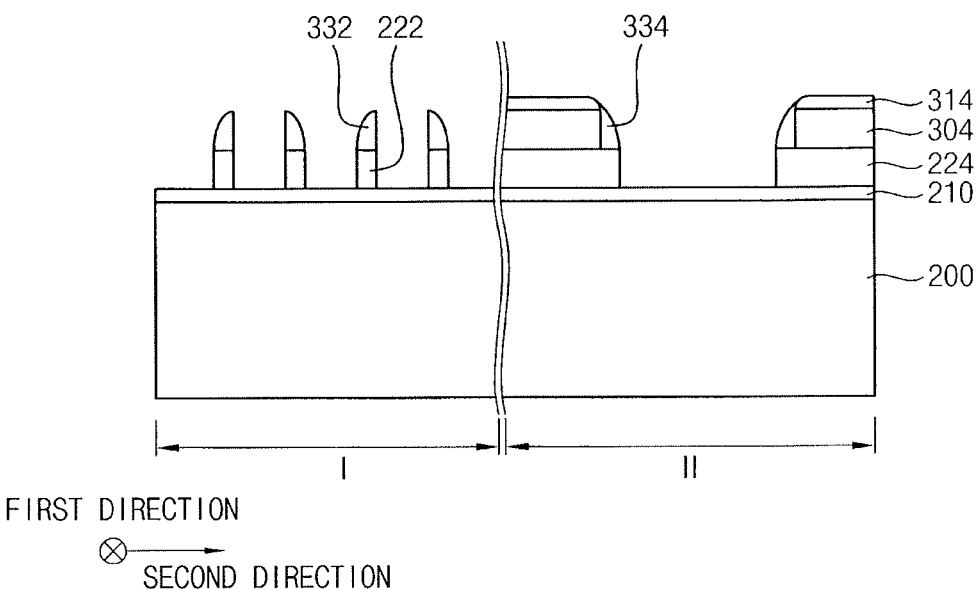

Referring to FIG. 15, the exposed first sacrificial layer pattern 302, e.g., in the first region I, may be removed. During the removal of the first sacrificial layer pattern 302, the second sacrificial layer pattern 304 may be covered by the second variable mask 314, e.g., in the second region II, and may not be removed. According to an exemplary embodiment, the first sacrificial layer pattern 302 may be removed by, e.g., an ashing and/or a strip process, a dry etching process, a wet etching process, etc.

The underlying hard mask layer 220 may be etched using the first and second spacers 332 and 334, the second variable mask 314, and the second sacrificial layer pattern 304 as etching masks. For example, a first hard mask 222 having a relatively small width may be formed in the first region I, e.g., using the first spacers 332 as an etching mask. A second hard mask 224 having a relatively large width may be formed in the second region II, e.g., using the second spacers 334, the second variable mask 314, and the second sacrificial layer pattern 304 as etching masks. During the etching process, the second variable mask 314 may be removed.

After forming the first hard mask 222 and the second hard mask 224, remaining portions of the second sacrificial layer 304 and the first and second spacers 332 and 334 may be removed.

Figure 16:
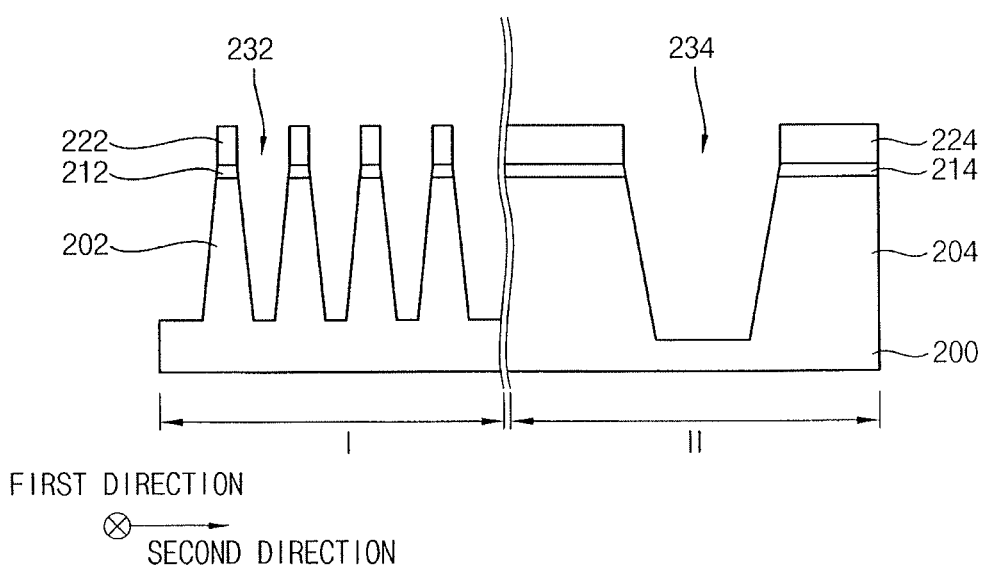

Referring to FIG. 16, stages substantially the same as or similar to those depicted with reference to FIG. 1 may be performed. For example, the pad layer 210 and an upper portion of the substrate 200 may be etched using the first and second hard masks 222 and 224 as etching masks. A first pad layer pattern 212 may be formed in the first region I and a second pad layer pattern 214 may be formed in the second region II. A first recess and a second recess may be formed at upper portions of the substrate 200 in the first region I and the second region II, respectively.

The first recess of the substrate 200, sidewalls of the first pad layer pattern 212, and sidewalls the first hard mask 222 may define a first trench 232. The second recess of the substrate 200, sidewalls of the second pad layer pattern 214, and sidewalls of the second hard mask 224 may define a second trench 234. A first active region 202 and a second active region 204 may be defined by the first and second trenches 232 and 234 in the first region I and the second region II, respectively. According to an exemplary embodiment, the second action region 204 may have a greater width, e.g., in the second direction, than the first active region 202. The first trench 232 may have a width smaller than, e.g., substantially smaller than, a width the second trench 234. As such, the width of the second trench 234, e.g., in the second direction, may be greater than the width of the first trench 232.

According to an exemplary embodiment, a plurality of first trenches 232 and a plurality of second trenches 234 may be formed. The first trenches 232 may have different widths from each other, e.g., ones of the plurality of first trenches 232 may have different widths in the second direction from other ones of the plurality of first trenches 232. The second trenches 234 may have also different widths from each other, e.g., ones of the plurality of second trenches 234 may have different widths in the second direction from other ones of the plurality of second trenches 232.

Figure 17:
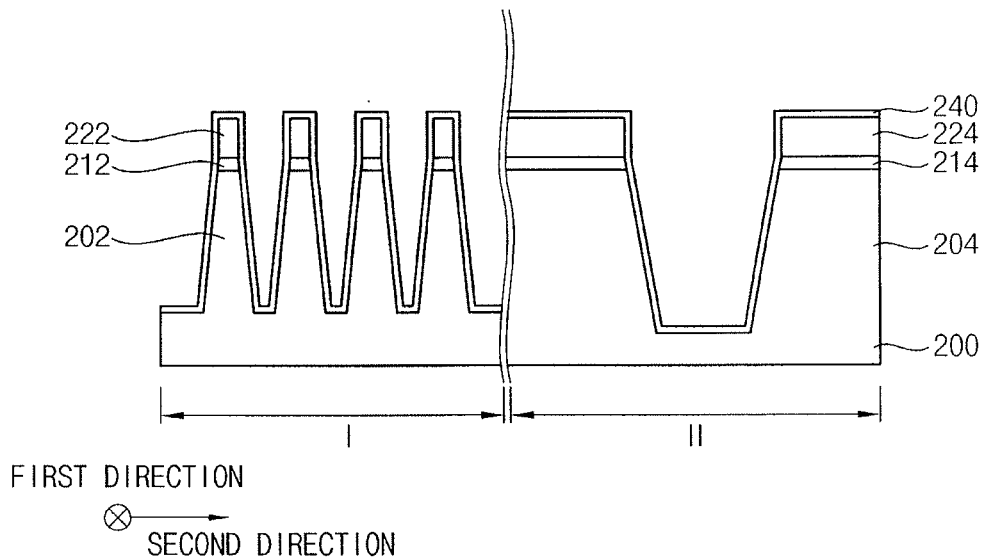

Referring to FIG. 17, stages substantially the same as or similar to those depicted with reference to FIG. 2 may be performed. For example, a first oxide layer 240 may be formed on inner walls of the first and second trenches 232 and 234 and on the first and second hard masks 222 and 224. The first oxide layer 240 may be a continuous layer.

Figure 18:
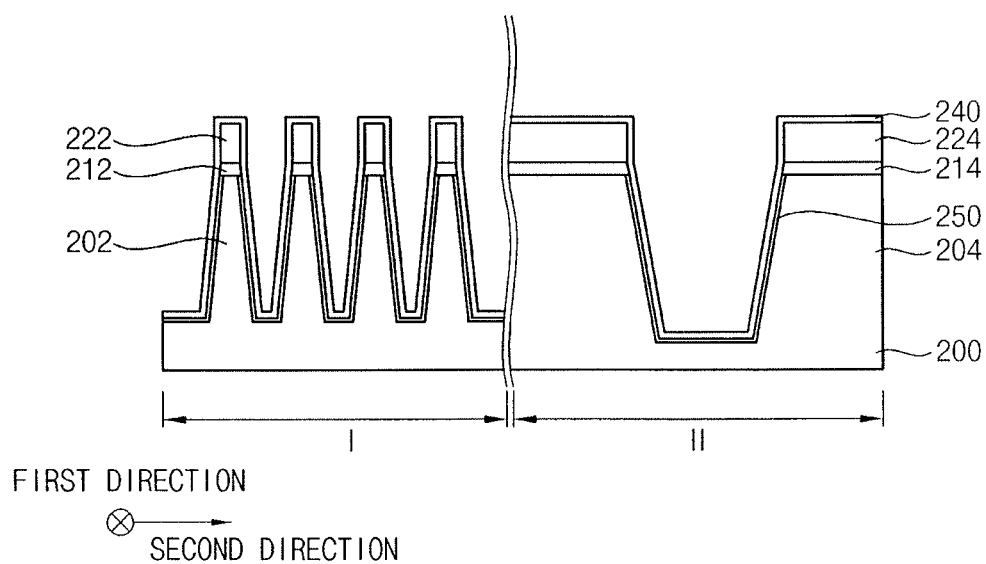

Referring to FIG. 18, stages substantially the same as or similar to those depicted with reference to FIG. 3 may be performed. For example, a portion of the substrate 200 adjacent to the first and second trenches 232 and 234 having the first oxide layer 240 may be oxidized to form a second oxide layer 250.

Figure 19:
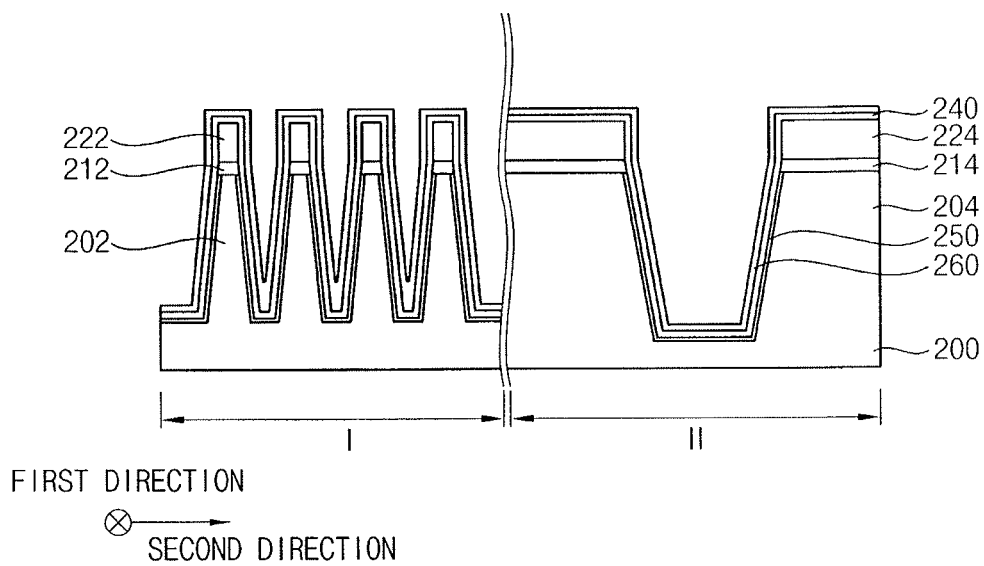

Referring to FIG. 19, stages substantially the same as or similar to those depicted with reference to FIG. 4 may be performed. For example, a nitride layer 260 may be formed on the first oxide layer 240. According to an exemplary embodiment, the nitride layer 260 may be formed by, e.g., one of a CVD process, a LPCVD process, etc. The nitride layer 260 may be formed, e.g., conformally formed, regardless of the widths of the first and second trenches 232 and 234. Stresses applied to the first and second active regions 202 and 204 may be balanced so that, e.g., the first and second active regions 202 and 204 may not lean.

Figure 20:
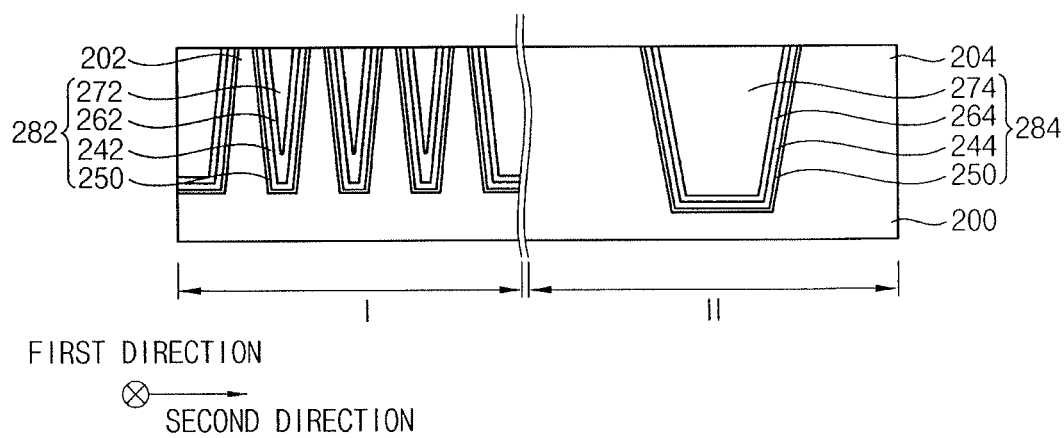
Figure 21:
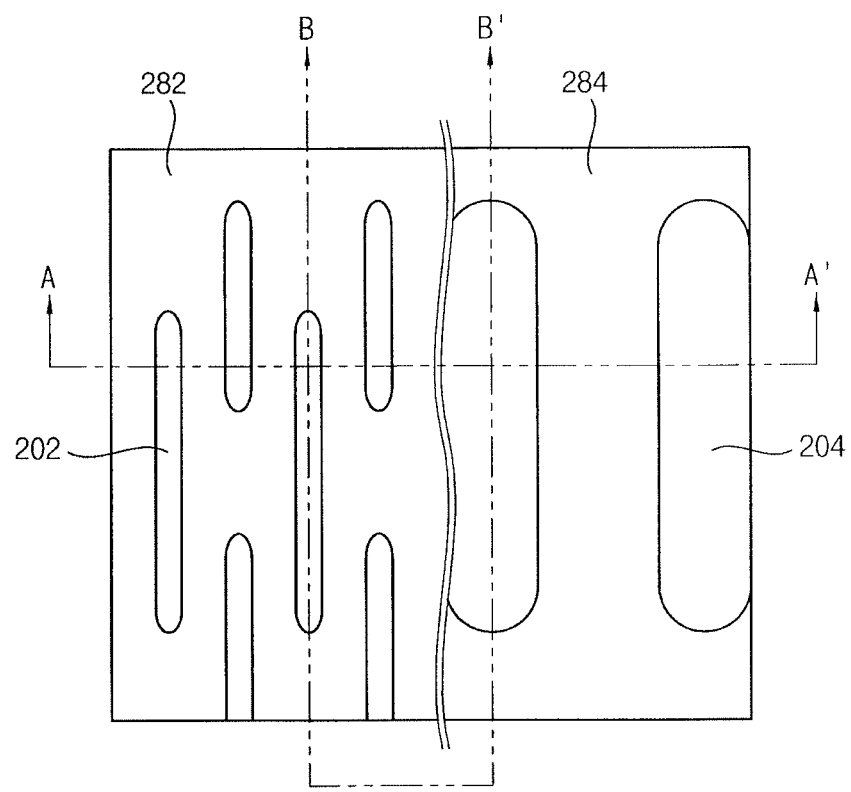
FIG. 21 illustrates a plan view of an exemplary semiconductor device.
Figure 21:

Referring to FIG. 20, stages substantially the same as or similar to those depicted with reference to FIGS. 5 and 6 may be performed. A first isolation structure 282 and a second isolation structure 284 may be formed in the first trench 232 and the second trench 234, respectively. The first isolation structure 282 may include the second oxide layer 250, a first oxide layer pattern 242, a first nitride layer pattern 262 and a first insulation layer pattern 272 sequentially stacked. The second isolation layer structure 284 may include the second oxide layer 250, a second oxide layer pattern 244, a second nitride layer pattern 264, and a second insulation layer pattern 274 sequentially stacked.

Referring to FIG. 21, a plurality of first active regions 202 and a plurality of second active regions 204 spaced apart from each other along a second direction may be formed. According to an exemplary embodiment, each of the first active regions 202 and each of the second active regions 204 may be formed to have a linear shape extending along a first direction substantially perpendicular to the second direction. The first active regions 202 may have a width and a length smaller, e.g., substantially smaller, than widths of the second active regions 204. A distance between the first active regions 202 may be smaller, e.g., substantially smaller, than distances between the second active regions 204. A width of the first active regions 202 in the first direction may be smaller than a width of the second active regions 204 in the first direction.

Figure 22:
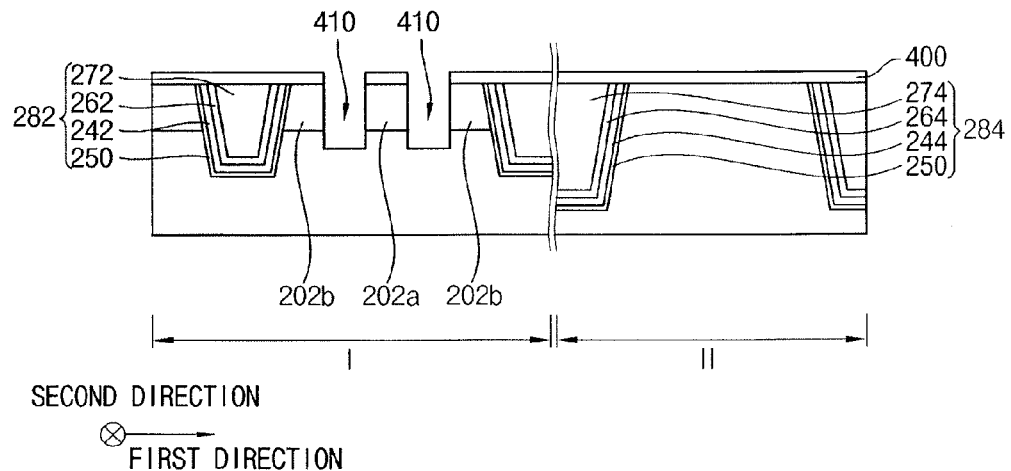

Referring to FIG. 22, impurities may be doped into upper portions of the substrate 200 in the first region I to form a first impurity region 202a and a second impurity region 202b. For example, the impurities may include n-type impurities, e.g., phosphorus or arsenic. The first and second impurity regions 202a and 202b may serve as source/drain regions of memory cells.

An upper portion of the substrate 200 in the first region I may be partially removed to form a third trench 410. The third trench 410 may be between the first and second impurity regions 202a and 202b. For example, the first and second impurity regions 202a and 202b may be alternately arranged with third trenches 410 therebetween.

According to an exemplary embodiment, a mask layer may be formed on the substrate 200, and the mask layer may be patterned by a photolithography process to form a third mask 400. As illustrated in FIG. 22, a recess of the substrate 200 and a sidewall of the third mask 400 may define the third trench 410. The upper portion of the substrate 200 may be etched using the third mask 400 as an etching mask. The mask layer may be formed using, e.g., silicon oxide.

Figure 23:
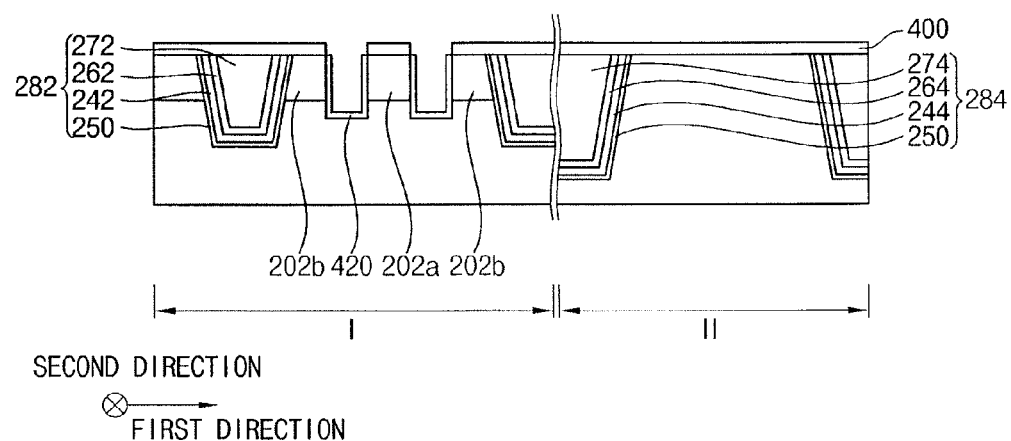

Referring to FIG. 23, a first gate insulation layer 420 may be formed on a top surface of the recessed substrate 200 exposed by the third trench 410, i.e., on the recess of the substrate 200.

In example embodiments, the first gate insulation layer 420 may be formed by, e.g., thermally oxidizing a top surface of the recessed substrate 200. For example, the first gate insulation layer 420 may be formed using silicon oxide and/or a metal oxide by a CVD process. The metal oxide may include, e.g., hafnium oxide, tantalum oxide, and/or zirconium oxide, etc.

Figure 24:
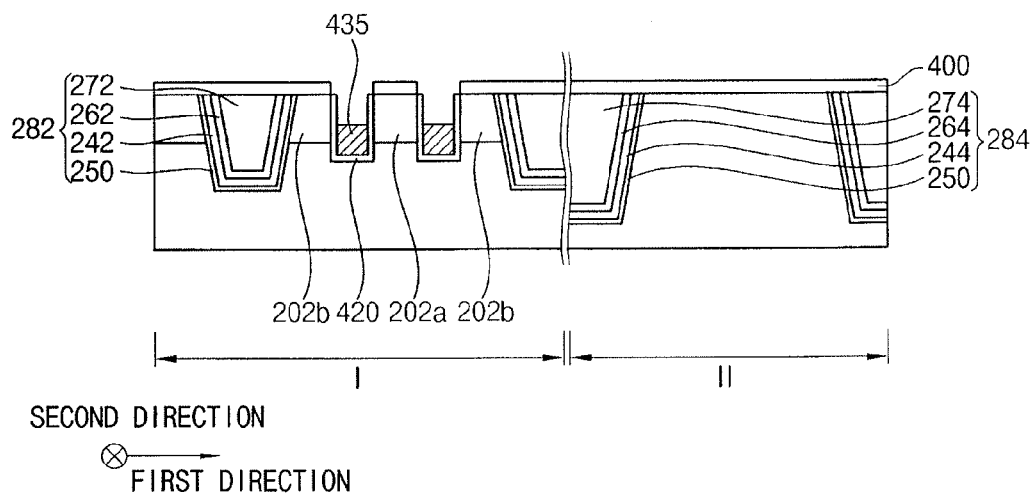

Referring to FIG. 24, a first gate electrode 435 may be formed to partially fill the third trench 410. For example, a first gate electrode layer may be formed on the first gate insulation layer 420 and the third mask 400 to sufficiently fill the third trench 410. Thereafter, an upper portion of the first gate electrode layer may be removed to form the first gate electrode 435.

The first gate electrode layer may be formed using, e.g., a metal, a metal nitride and/or a metal silicide. For example, the first gate electrode layer may be formed of tungsten, titanium nitride, etc. The first gate electrode layer may be formed by, e.g., an ALD process, a PVD process, etc. A heat treatment process, e.g., a rapid thermal annealing (RTA) process, a spike-RTA, a flash RTA process, a laser annealing process, etc. may be further performed on the first gate electrode layer.

The upper portion of the first gate electrode layer may be removed by, e.g., a planarization process and/or an anisotropic etching process. For example, the upper portion of the first gate electrode layer may be planarized by a chemical mechanical polishing (CMP) process until a top surface of the third mask 400 is exposed. A portion of the first gate electrode layer in the third trench 410 may be removed by a dry etching process. According to an exemplary embodiment, the first gate electrode 435 may be formed to have a top surface substantially lower than that of the substrate 200 where the third trench 410 may not formed, e.g., the top surface of the first gate electrode 435 may be lower than an uppermost surface of the substrate 200.

Figure 25:
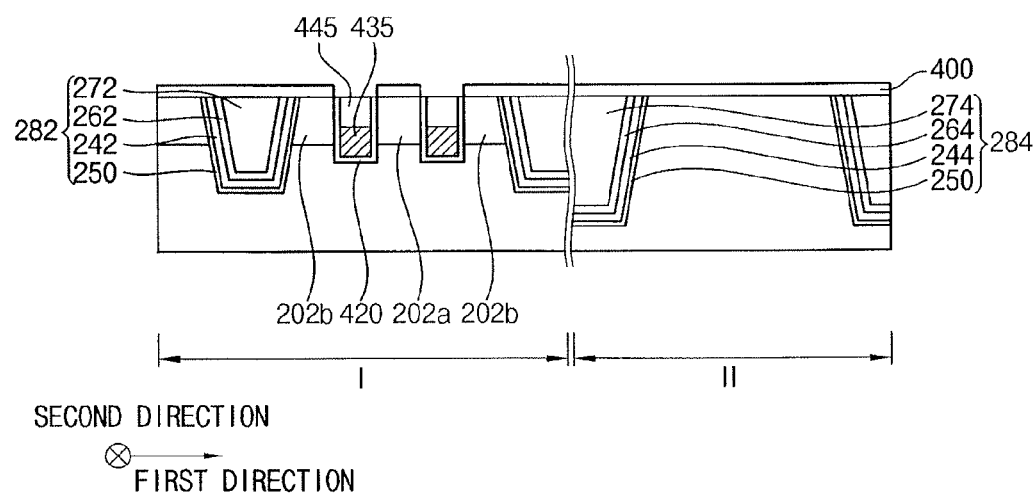

Referring FIG. 25, a capping layer pattern 445 may be formed on the first gate electrode 435 to fill, e.g., completely fill, a remaining portion of the recess in the substrate 200. For example, a capping layer may be formed on the first gate insulation layer 420, the first gate electrode 435, and the third mask 400 to fill a remaining portion of the third trench 410. The capping layer may be formed using, e.g., silicon oxide. An upper portion of the capping layer may be removed by, e.g., a CMP process, until the top surface of the third mask 400 is exposed. A portion of the capping layer at an upper portion of the third trench 410 may be removed by, e.g., an etch-back process, to form the capping layer pattern 445. Therefore, a first gate structure may be formed that includes the first gate electrode 435, the first gate insulation layer 420, and the capping layer pattern 445. The first gate insulation layer 420 may surround, e.g., completely surround, the first gate electrode 435 and the capping layer pattern 445 in the third trench 410. The first gate structure and the first and second impurity regions 202a and 202b may be referred to as a first transistor.

Figure 26:
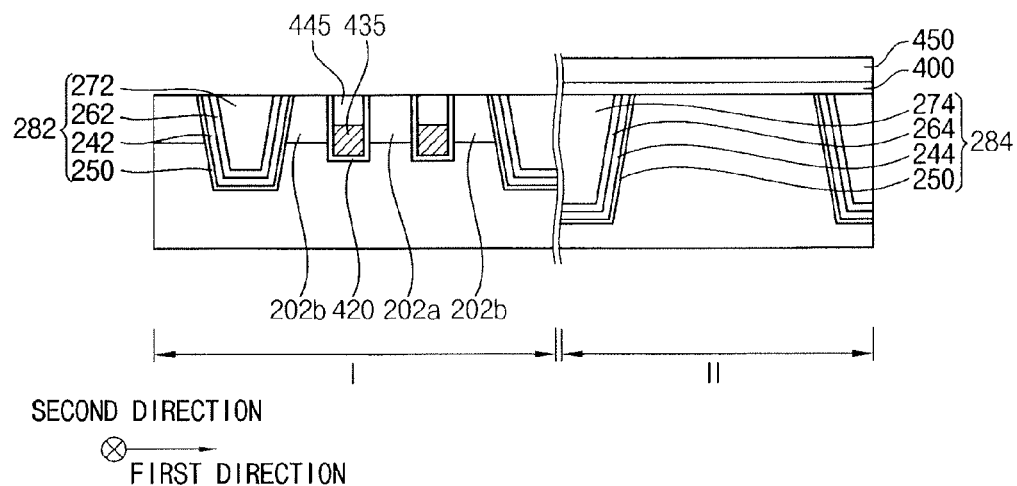

Referring to FIG. 26, a first photoresist pattern 450 may be formed on the third mask 400 in the second region II. A portion of the third mask 400 in the first region I may be etched, e.g., removed, using the first photoresist pattern 450 as an etching mask. According to an exemplary embodiment, the etching process may be performed using, e.g., buffered oxide etchant (BOE) and/or hydrogen fluoride (HF). Thereafter, the first photoresist pattern 450 may be removed by, e.g., an aching process and/or a stripping process.

Figure 27:
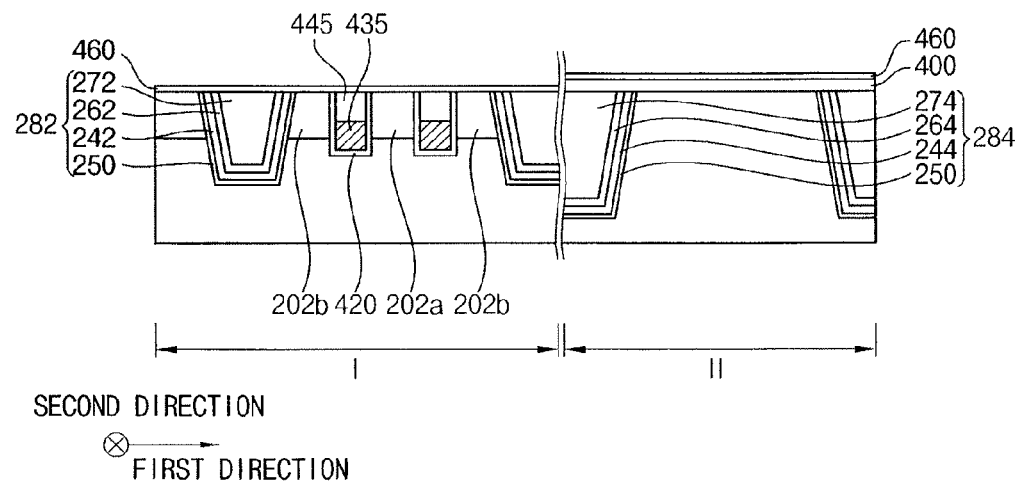

Referring to FIG. 27, a blocking layer 460 may be formed on the substrate 200, the first and second isolation structures 282 and 284, and the third mask 400 to cover the first and second regions I and II. In example embodiments, the blocking layer 460 may be formed using, e.g., silicon nitride.

Figure 28:
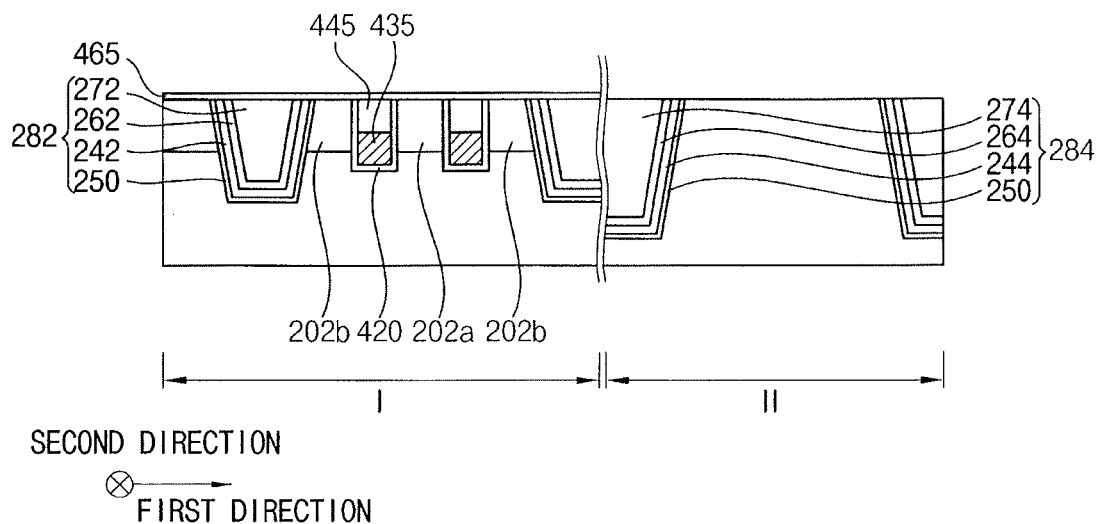

Referring to FIG. 28, the blocking layer 460 in the second region II may be removed by, e.g., a CMP process. Thus, forming a blocking layer pattern 465 in the first region I. Further, a remaining portion of the third mask 400 in the second region II may be removed. According to an exemplary embodiment, the third mask 400 may be removed by, e.g., a wet etching process using a BOE solution and/or a HF solution. The blocking layer pattern 465 including, e.g., silicon nitride, may not be substantially removed due to, e.g., a low etch rate thereof.

Figure 29:
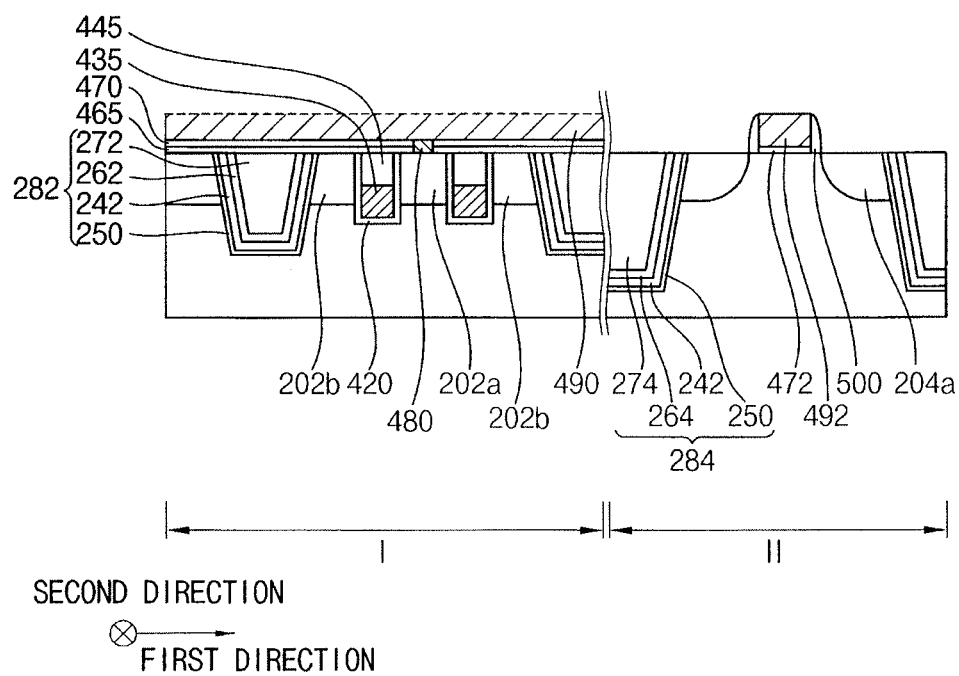

Referring to FIG. 29, an insulation layer may be formed on the substrate 200 in the second region II and the blocking layer pattern 465. For example, the insulation layer may be formed using, e.g., silicon oxide by a CVD process. A portion of the insulation layer on the blocking layer pattern 465 in the first region I may be referred to as a first insulating interlayer 470. A portion of the insulation layer on the substrate 200 in the second region II may be referred to as a second gate insulation layer.

A first opening (not illustrated) may be formed through the first insulating interlayer 470 and the blocking layer pattern 465 to expose the first impurity region 202a. A first conductive layer may be formed on the substrate 200 and the first insulating interlayer 470 to fill the first opening. Thereafter, an upper portion of the first conductive layer may be planarized to form a first plug 480 electrically connected to the first impurity region 202a. According to an exemplary embodiment, the first conductive layer may be formed using, e.g., a metal, a metal nitride, a metal silicide and/or doped polysilicon.

A second conductive layer may be formed on the first insulating interlayer 470, the first plug 480, and the second gate insulation layer. The second conductive layer may be patterned to form a bit line 490 that is electrically connected to the first plug 480 on the first insulating interlayer 470 in the first region I. The second conductive layer may be patterned to form a second gate electrode 492 on the second gate insulation layer in the second region II. The second conductive layer may be patterned by, e.g., a plasma etching process.

The second gate insulation layer in the second region II may be patterned, e.g., using the second gate electrode 492 as an etching mask, to form a second gate insulation layer pattern 472 under the second gate electrode 492. The second gate electrode 492 and the second gate insulation layer pattern 472 may be referred to as a second gate structure.

A third spacer 500 may be formed on a sidewall of the second gate structure. An ion implantation process using the second gate structure and the third spacer 500 as an ion implantation mask may be performed to form a third impurity region 204a at upper portion of the substrate 200 adjacent to the second gate structure. According to an exemplary embodiment, a silicon nitride layer may be formed in the second region II on the substrate 200 to cover the second gate structure. The silicon nitride layer may be patterned by, e.g., an anisotropic etching process, to form the third spacer 500. The second gate structure and the third impurity region 204a may be referred to as a second transistor.

Figure 30:
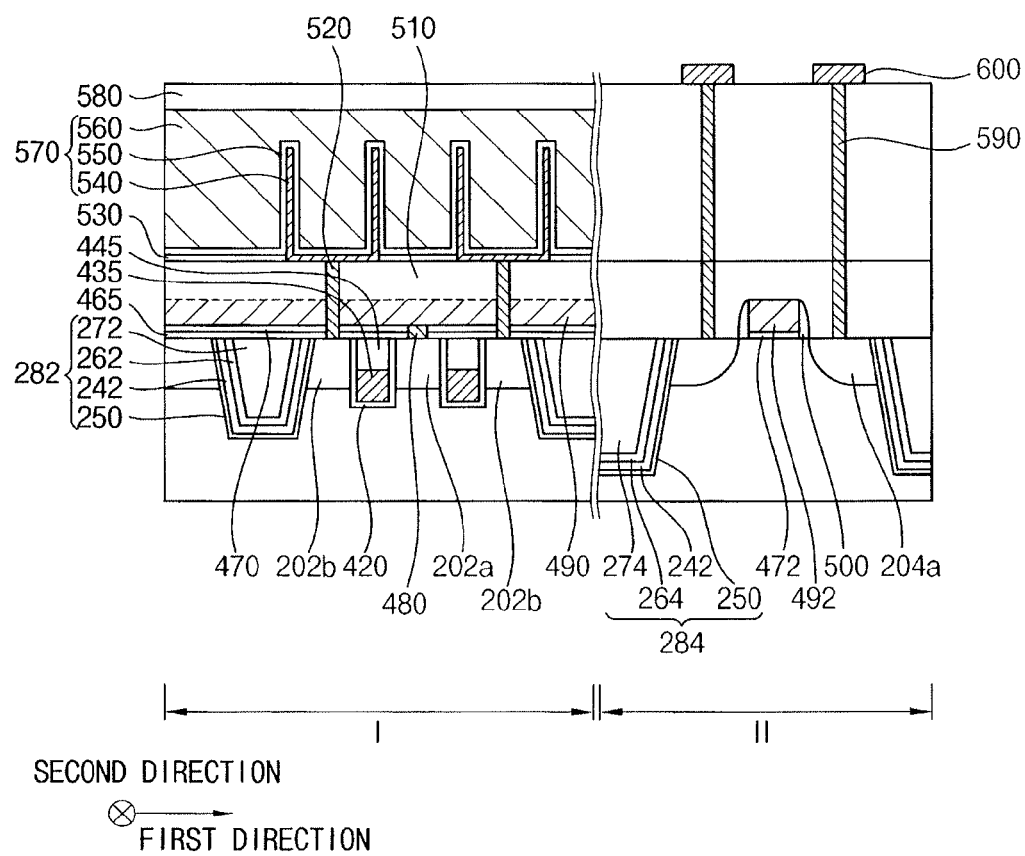

Referring to FIG. 30, a second insulating interlayer 510 may be formed on the first insulating interlayer 470, the first plug 480 and the substrate 200 to cover the bit line 490, the second gate structure and the third spacer 500.

A second opening (not illustrated) may be formed through the second insulating interlayer 510, the first insulating interlayer 470, and the blocking layer pattern 465 to expose the second impurity region 202b. A third conductive layer may be formed on the substrate 200 and the second insulating interlayer 510 to fill the second opening. The third conductive layer may be formed using, e.g., doped polysilicon, a metal, a metal nitride and/or a metal silicide. An upper portion of the third conductive layer may be planarized until a top surface of the second insulating interlayer 510 is exposed, so that a second plug 520 electrically connected to the second impurity region 202b may be formed.

An etch stop layer 530 and a mold layer (not illustrated) may be formed on the second insulating interlayer 510. The mold layer and the etch stop layer 530 may be partially removed to form a third opening (not illustrated) exposing a top surface of the second plugs 520.

A lower electrode layer may be formed on a bottom and a sidewall of the third opening and a top surface of the mold layer. The lower electrode may be formed using, e.g., a metal, a metal nitride such as titanium, titanium nitride, tantalum, tantalum nitride, tungsten nitride, ruthenium, etc., and/or doped polysilicon. A sacrificial layer (not illustrated) may be formed on the lower electrode layer. The sacrificial layer (not illustrated) and the mold layer (not illustrated) may be partially removed to expose a top surface of the mold layer. The sacrificial layer (not illustrated) and the mold layer (not illustrated) may be removed to form a lower electrode 540 electrically connected to the second plugs 520.

A dielectric layer 550 may be formed on the etch stop layer 530 to cover the lower electrode 540. The dielectric layer 550 may be formed using, e.g., a material having a dielectric constant higher and/or substantially higher than that of silicon nitride.

An upper electrode 560 may be formed on the dielectric layer 550. The upper electrode 560 may be formed using, e.g., a metal and/or a metal nitride such as titanium nitride, tantalum nitride, tungsten nitride, ruthenium nitride, etc. Accordingly, a capacitor 570 including the lower electrode 540, the dielectric layer 550, and the upper electrode 560 may be formed.

A third insulating interlayer 580 may be formed on the second insulating interlayer 510 to cover the capacitor. A fourth opening (not illustrated) may be formed through the third insulating interlayer 580 in the second region II to expose the third impurity region 204a. A fourth conductive layer may be formed on the third impurity region 204a and the third insulating interlayer 580 to fill the fourth opening. An upper portion of the fourth conductive layer may be planarized until a top surface of the third insulating inter layer 580 is exposed. Accordingly, a third plug 590 electrically connected to the third impurity region 204a may be formed.

Wiring 600 electrically connected to the third plug 590 may be formed. A protection layer (not illustrated) protecting the wiring 600 may be further formed, e.g., so that the semiconductor device may be completed.

By way of summation and review, as the integration degree of semiconductor devices may be increased, a width of an isolation layer may be decreased. Isolation layers having different widths may be formed depending on the location. A nitride layer may not be conformally formed in a trench having a small width. Thus, unequal stress may be applied to an active region. For example, in case of an active region between a first trench having a large width and a second trench having a small width, the nitride layer may be conformally formed on one side of the active region and may not be conformally formed on another side of the active region. Accordingly, a net stress applied to the active region may not be balanced and a leaning phenomenon of the active region may occur In other words, when forming an isolation layer of a semiconductor device, a trench may be formed on a substrate, a liner may be formed on an inner wall of the trench, and an insulation layer may fill a remaining portion of the trench. As a width of the trench decreases, the liner and the insulation layer may not be formed conformally so that, e.g., a stress applied to active regions adjacent to the trench by the liner may not be uniform. Accordingly, an inclination of the active regions may be formed.

The liner may include a thermally oxidized layer formed to, e.g., cure damage that may have occurred during a formation of the trench, and a second oxide layer formed on the thermally oxidized layer by, e.g., a CVD process to reduce the possibility of and/or prevent a HEIP (hot electron induced punch through) phenomenon. The oxide layers may have a compressive stress. A nitride layer having a tensile stress may be formed on the oxide layers to, e.g., reduce a stress applied to an active region of the substrate. An insulation layer may be formed to fill a remaining portion of the trench.

In contrast, embodiments, e.g., the exemplary embodiments discussed above, may include a thermally oxidized layer formed after a formation of a second oxide layer. Accordingly, the second oxide layer may serve as a barrier in a formation of the thermally oxidized layer. A space may be provided in a trench having a small width so that the nitride layer may be conformally formed therein. In particular, the second oxide layer may not be formed in the trench, and thus the nitride layer may be formed conformally in the trench despite a relative small width of the trench. As a result, a stress applied to the active region by the first oxide layer, the second oxide layer and the nitride layer may be balanced to reduce the possibility of and/or prevent the active region from leaning. Therefore, embodiments may relate to a method of forming an isolation structure having a relatively small width and being capable of applying substantially uniform and/or small stress to an active region.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming an isolation structure, the method comprising:
    forming a trench at an upper portion of a substrate;
    forming a first oxide layer on an inner wall of the trench;
    oxidizing a portion of the substrate adjacent to the trench to form a second oxide layer such that the portion of the substrate adjacent to the trench has the first oxide layer thereon;
    forming a nitride layer on the first oxide layer; and
    forming an insulation layer pattern on the nitride layer such that the insulation layer pattern fills a remaining portion of the trench.

2. The method as claimed in claim 1, wherein the first oxide layer is formed by a chemical vapor deposition process.

3. The method as claimed in claim 1, wherein the first oxide layer and the second oxide layer have compressive stresses and the nitride layer has a tensile stress.

4. The method as claimed in claim 1, wherein the insulation layer pattern is formed using a flowable oxide.

5. The method as claimed in claim 1, wherein forming the insulation layer pattern includes performing a heat treatment process.

6. The method as claimed in claim 1, wherein forming the trench includes:
    forming a mask on the substrate, and
    etching the upper portion of the substrate using the mask as an etching mask.

7. A method of forming an isolation structure, the method comprising:
    forming a plurality of trenches at upper portions of a substrate, the plurality of trenches having different widths from each other;
    forming a first oxide layer on inner walls of the plurality of trenches;
    oxidizing a portion of the substrate adjacent to each of the plurality of trenches to form a second oxide layer such that each of the plurality of trenches has the first oxide layer formed thereon;
    forming a nitride layer on the first oxide layer; and
    forming an insulation layer pattern on the nitride layer such that the insulation layer pattern fills remaining portions of the plurality of trenches.

8. The method of claim 7, wherein the first oxide layer is formed by a chemical vapor deposition process.

9. The method as claimed in claim 7, wherein the first oxide layer and the second oxide layer have compressive stresses and the nitride layer has a tensile stress.

10. The method as claimed in claim 7, wherein:
    the insulation layer pattern is formed using a flowable oxide, and
    forming the insulation layer pattern includes performing a heat treatment process.

11. The method as claimed in claim 7, wherein forming the plurality of trenches includes:
    forming a mask on the substrate, and
    etching upper portions of the substrate using the mask as an etching mask.

12. The method as claimed in claim 11, wherein the first oxide layer is formed on the mask and on inner walls of each of the plurality of trenches.

13. The method as claimed in claim 12, wherein forming the insulation layer pattern includes:
    forming an insulation layer on the nitride layer such that the insulation layer fills remaining portions of the plurality of trenches, and
    planarizing upper portions of the insulation layer, the nitride layer, and the first oxide layer until a top surface of the substrate is exposed.

14. The method as claimed in claim 13, after forming the insulation layer, further comprising performing a heat treatment process on the insulation layer.

15. The method as claimed in claim 11, wherein forming the mask includes:
    forming a mask layer on the substrate,
    forming a sacrificial layer pattern on the mask,
    forming a spacer on a sidewall of the sacrificial layer pattern,
    removing the sacrificial layer pattern, and
    patterning the mask layer using the spacer as an etching mask.

16. A method of forming a semiconductor device, the method comprising:
    forming a plurality of first trenches adjacent to first active regions and forming a plurality of second trenches adjacent to second active regions, the first and second trenches being formed in a substrate, and the second trenches having a greater width than the first trenches;

forming a first oxide layer on inner walls of the first and second trenches;

forming a second oxide layer by oxidizing portions of the substrate surrounding the first and second trenches, the second oxide layer being formed after forming the first oxide layer such that the second oxide layer is between the substrate and the first oxide layer;

forming a nitride layer on the first oxide layer in the first and second trenches; and forming an insulation layer pattern on the nitride layer such that the insulation layer pattern fills remaining portions of the first and second trenches.

17. The method as claimed in claim 16, wherein the nitride layer is formed directly on the first oxide layer after forming the second oxide layer.

18. The method as claimed in claim 17, further comprising:
forming first gate structures in the substrate in the first active regions; and
forming second gate structures on the substrate in the second active regions.

19. The method as claimed in claim 17, the nitride layer has a tensile stress substantially equal to a total of a compressive stress of the first oxide layer and a compressed stress of the second oxide layer.

20. The method as claimed in claim 19, wherein the nitride layer is conformally formed on inner walls of the first and second trenches.

* * * * *